(12) United States Patent
Wieczorek et al.

(10) Patent No.: US 6,900,111 B2
(45) Date of Patent: May 31, 2005

(54) METHOD OF FORMING A THIN OXIDE LAYER HAVING IMPROVED RELIABILITY ON A SEMICONDUCTOR SURFACE

(75) Inventors: Karsten Wieczorek, Boxdorf (DE); Stephan Krügel, Boxdorf (DE); Falk Graetsch, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/126,423

(22) Filed: Apr. 19, 2002

(65) Prior Publication Data

US 2003/0008524 A1 Jan. 9, 2003

(30) Foreign Application Priority Data

Jul. 4, 2001 (DE) .......................................... 101 32 430

(51) Int. Cl.[7] .......................................... H01L 21/8238
(52) U.S. Cl. ..................... 438/423; 438/407; 438/766; 438/770; 438/773; 438/798; 438/966
(58) Field of Search ................................. 438/423, 407, 438/766, 770, 773, 798, 966, 913, FOR 399, FOR 450

(56) References Cited

U.S. PATENT DOCUMENTS

| | | | | |
|---|---|---|---|---|
| 4,154,873 A | * | 5/1979 | Hickox et al. | 438/770 |
| 5,244,843 A | * | 9/1993 | Chau et al. | 438/452 |
| 5,294,571 A | * | 3/1994 | Fujishiro et al. | 438/770 |
| 5,334,556 A | | 8/1994 | Guldi | 437/248 |
| 5,849,643 A | * | 12/1998 | Gilmer et al. | 438/773 |
| 5,946,588 A | * | 8/1999 | Ahmad et al. | 438/585 |
| 6,077,751 A | * | 6/2000 | Marcus et al. | 438/308 |
| 6,160,271 A | * | 12/2000 | Yamazaki et al. | 257/59 |
| 6,207,591 B1 | | 3/2001 | Aoki et al. | 438/795 |
| 6,258,635 B1 | * | 7/2001 | Miyoshi et al. | 438/143 |
| 6,268,298 B1 | | 7/2001 | Komura et al. | 438/787 |
| 6,291,284 B1 | * | 9/2001 | Sato | 438/231 |
| 2001/0031229 A1 | * | 10/2001 | Spjut et al. | 422/186.3 |
| 2001/0041419 A1 | * | 11/2001 | Ito | 438/424 |
| 2002/0177273 A1 | * | 11/2002 | Lee et al. | 438/240 |
| 2003/0013266 A1 | * | 1/2003 | Fukuda et al. | 438/400 |

FOREIGN PATENT DOCUMENTS

JP    11260750 A    9/1999    .......... H01L/21/265

* cited by examiner

Primary Examiner—George Fourson
Assistant Examiner—Joannie Adelle Garcia
(74) Attorney, Agent, or Firm—Williams, Morgan & Amerson, P.C.

(57) ABSTRACT

A method for forming a reliable and ultra-thin oxide layer, such as a gate oxide layer of an MOS transistor, comprises an annealing step immediately performed prior to oxidizing a substrate. The annealing step is performed in an inert gas ambient to avoid oxidation of the semiconductor surface prior to achieving a required low oxidizing temperature. Preferably, the annealing step and the oxidizing step are carried out as an in situ process, thereby minimizing the thermal budget of the overall process.

19 Claims, 3 Drawing Sheets

METHOD OF FORMING A THIN OXIDE LAYER HAVING IMPROVED RELIABILITY ON A SEMICONDUCTOR SURFACE

BACKGROUND OF THE INVENTION

1. Field of the Invention

The present invention relates to the field of fabricating semiconductor devices, such as MOS transistors, requiring thin oxide layers formed on a semiconductor surface to electrically insulate the semiconductor surface from an electrically active region, such as a gate electrode, formed over the semiconductor surface.

2. Description of the Related Art

The dimensions of modern integrated circuits are steadily shrinking, while at the same time providing both improved device performance and circuit density. Both advantages are mainly obtained by steadily shrinking the feature sizes of the individual semiconductor devices, such as MOS transistors, whereby critical dimensions, i.e., minimum feature sizes that can be reproducibly printed onto the substrate, are currently approaching the 0.1 μm range. The formation of modern ultra high-density integrated circuits requires 500 process steps or more, wherein one of the most critical steps is the formation of the gate electrode of the transistors. The gate electrode controls, upon application of a suitable control voltage, for example 2–3 V, the current flow through a channel that forms below a thin gate oxide layer separating the gate electrode from the underlying semiconductor region. The lateral dimension of the gate electrode, along which the highly doped source and drain regions are separated by the channel region, significantly affects the device performance with respect to signal propagation time and current flow from the source to the drain. Trimming this lateral gate dimension, also referred to as gate length, down to a size of about 0.1 μm necessitates an enormous effort to establish an appropriate photolithography technique and sophisticated etch trim method.

The reduction of the gate length is, however, only one aspect to accomplish improved device performance. Another important factor in scaling down the feature sizes of a MOS transistor to obtain superior device characteristics is the provision of a sufficiently thin oxide layer that electrically insulates the gate electrode from the underlying channel region. The reason for this is that for a given set of voltages applied to the terminals of the transistor, such as the drain/source voltage and the gate voltage, the drain current is inversely proportional to the thickness of the gate oxide layer. Accordingly, to obtain superior device performance, it is essential to minimize the thickness of the gate oxide, while, at the same time, insuring that the gate oxide layer exhibits long-term reliability and does not break down during operations. For example, while a typical thickness of an advanced gate oxide layer in 1990 was in the range of about 20–25 nm, the thickness of a gate oxide layer of sophisticated MOS transistors in modern CPUs is today in the range of about 2–3 nm. On the other hand, the operating voltage applied to the gate electrode during operation of the device has only been reduced by a factor of approximately 2–3, compared to a factor of approximately 6–7 for the thickness of the gate oxide layer. Thus, the voltage per length, i.e., the electrical field across the gate oxide, has become significantly larger in modern integrated circuits. Therefore, the intrinsic reliability of the gate oxide layer, i.e., the robustness of the gate oxide layer against leakage current, charge carrier accumulation and electrical breakdown, significantly determines the maximum gate voltage allowed for a given target product lifetime. Thus, one of the most significant challenges for process engineers is to provide a sophisticated process technique that results in uniform and reproducibly high quality gate oxide layers exhibiting a layer thickness of only a few atomic layers.

One important factor adversely affecting the quality of a thin gate oxide layer is the out-diffusion of dopant ions injected into the semiconductor substrate to define the active region in which the transistor is to be formed. The active region is also denoted as p-well or n-well depending on the type of MOS transistor. This out-diffusion occurs due to the elevated temperatures during various heat treatments necessary to, for example, cure implantation-induced damage caused during ion implantation of the dopant ions. Since each heating process of the substrate significantly accelerates the process of diffusion of the dopant ions, which will finally blur the required profile of the dopant concentration within the active regions, a so-called thermal budget of the substrate may not exceed a specified design value that depends on operating conditions of the device and on the targeted lifetime of the device. The thermal budget can be quantified as the area under a time-diffusivity (t-D) curve, wherein the diffusion activity of the dopants in the semiconductor are shown depending on the time for which the diffusion has taken place. As the diffusivity is a function of temperature to which the substrate is exposed during the various process steps, an optimum performance and lifetime is obtained only when the thermal budget is minimized. The t-D curve not only represents the temperature dependence of the diffusion activity of the dopants, but also includes the activation energy for the different processes. As a consequence, the reliability of a thin gate oxide layer formed in the vicinity of doped semiconductor regions is significantly affected by dopant atoms diffused in the vicinity or into the gate oxide layer during various process steps, and, in particular, during annealing of the substrate to reduce implantation-induced damage in the substrate. Moreover, the presence of crystalline defects in the vicinity of the gate oxide layer that may possibly be generated by ion-implantation and that are not sufficiently repaired by heating the substrate, also significantly contributes to the reliability of the gate oxide. These defects may act as scattering centers for charge carriers during operation of the device and may inject an increased number of charge carriers into the gate oxide layer. Furthermore, these crystalline defects may adversely influence the growth of the oxide layer, with respect to the quality of the oxide, since the required thickness of the gate oxide layer is only a few atomic layers.

Accordingly, there exists a need for an improved method of forming a thin oxide layer on a semiconductor surface comprising a doped region.

SUMMARY OF THE INVENTION

According to one embodiment of the present invention, a method of forming an oxide layer on a surface portion of a substrate having implanted semiconductor regions formed therein comprises establishing an inert gas ambient and exposing the substrate to the inert gas ambient. Moreover, the method comprises annealing the substrate to reduce implantation-induced damage in the semiconductor region and transforming the inert gas ambient into an oxidizing ambient to form therein the oxide layer on the surface portions.

According to a further embodiment of the present invention, an in situ method of forming a gate oxide layer on a semiconductor surface of a substrate having formed therein an ion implanted active region comprises annealing the substrate at a first temperature for a first time period in an inert gas ambient for curing implantation-induced damage. Moreover, the method comprises oxidizing the semiconductor surface in an oxidizing ambient at a second temperature for a second time period.

BRIEF DESCRIPTION OF THE DRAWINGS

The invention may be understood by reference to the following description taken in conjunction with the accompanying drawings, in which like reference numerals identify like elements, and in which.

Figure 1A:
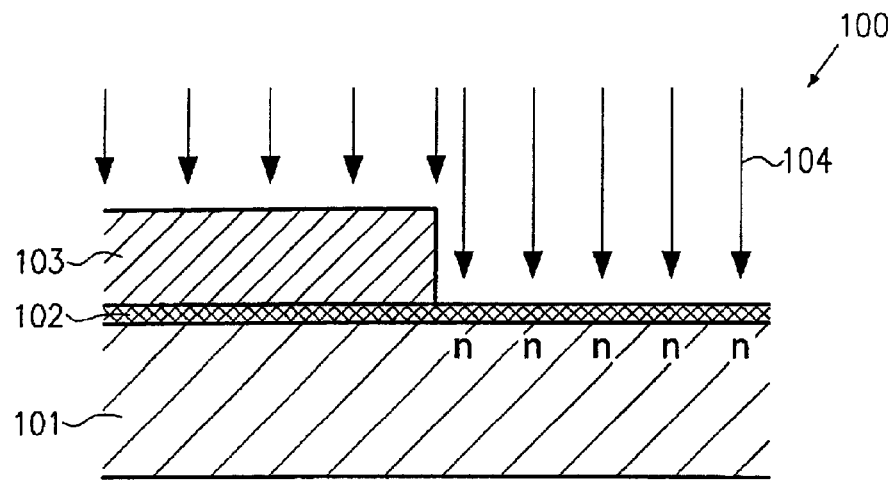
FIGS. 1a–1g schematically show cross-sectional views of a semiconductor device during various manufacturing stages in forming n- and p-doped active regions and a gate oxide for a CMOS semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As has been previously explained, the performance of a semiconductor de vice containing MOS transistors, such as, for example, a complementary MOS transistor pair used in CMOS technology, significantly depends on the quality and reliability of the gate oxide layer, e.g., silicon dioxide, of the MOS transistors. Since the manufacturing steps preceding the actual formation of the gate oxide layer influence the quality and thus the reliability of the gate oxide layer, illustrative embodiments of the present invention will be described with reference to FIGS. 1 and 2, starting with the formation of n- and p-wells of a complementary MOS transistor element. It is to be understood, however, that the embodiments described below are also applicable to NMOS transistors, PMOS transistors, and any other semiconductor device requiring a thin oxide layer over an activated semiconductor region.

FIG. 1a is a schematic cross-sectional view of a semiconductor device at an initial manufacturing stage. In FIG. 1a, a semiconductor structure 100 comprises a substrate 101, for example, a silicon bulk substrate or a silicon substrate having a lightly doped semiconductor layer epitaxially grown thereon. For the sake of simplicity, the substrate 101 is depicted as a bulk silicon substrate, in which active regions have to be formed, although an epitaxially grown semiconductor layer actually exhibits more superior qualities than a bulk substrate. On the substrate 101, a thin oxide layer 102 is formed, also referred to as pad oxide, on the surface of which an implantation mask 103 is formed that may be comprised of, for example, silicon nitride.

The implantation mask 103 is formed by photolithographic techniques as are well known in the art. Subsequently, phosphorous ions are implanted, indicated by the arrow 104, into a region of the substrate 101 that is not covered by the implantation mask 103. The penetration of the phosphorous ions into the substrate 101 is indicated by the character "n" in FIG. 1a. The oxide layer 102 typically has a thickness of approximately 40–50 nm and it is formed to serve as a stress relief layer between the substrate 101 and a silicon nitride film deposited to pattern the implantation mask 103.

Figure 1B:
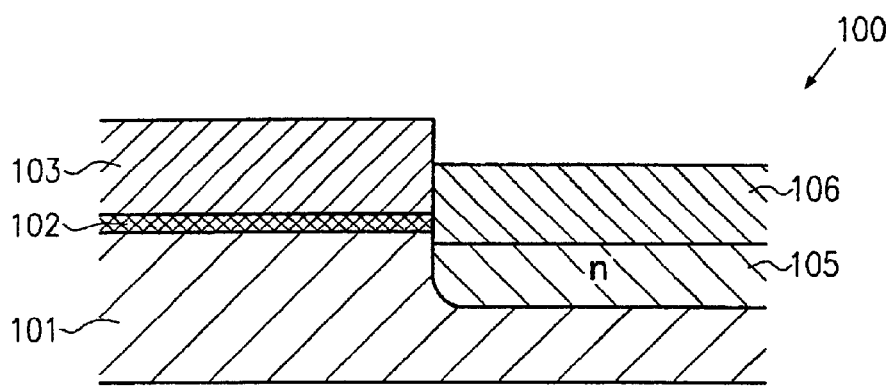

FIG. 1b schematically shows the semiconductor structure 100 with an implantation mask 106 in the form of a silicon dioxide layer that covers an n-well region 105 that has been defined by the preceding implantation step. The thickness of the implantation mask 106 is selected so as to block the ions of a subsequent implantation step to form a p-well region. Typically, formation of the silicon dioxide of the implantation mask 106 is obtained by wet oxidizing the substrate 101, wherein no oxide is formed on the implantation mask 103 since silicon nitride acts as a diffusion barrier.

Figure 1C:
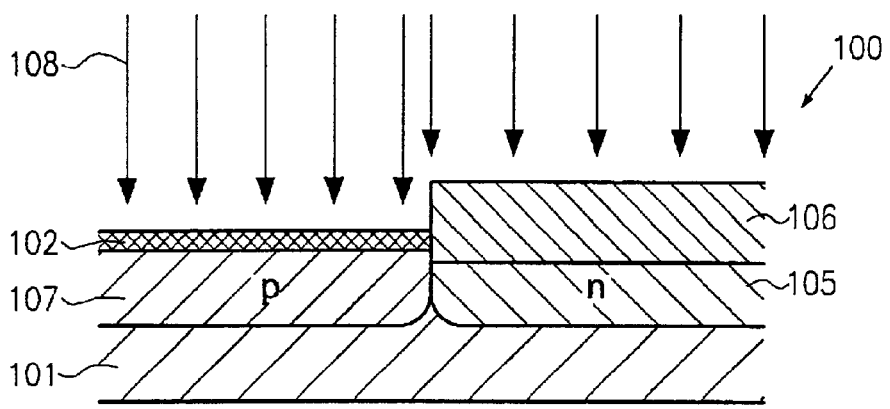

FIG. 1c schematically shows the semiconductor structure 100 with the implantation mask 103 removed. A p-well region 107 is formed under an area not covered by the implantation mask 106 by penetrating boron ions indicated as 108.

Figure 1D:
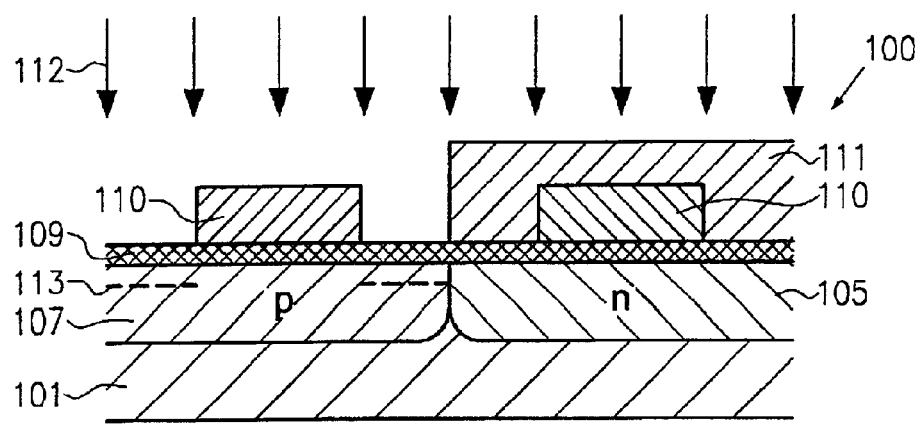

FIG. 1d schematically depicts the semiconductor structure 100 in an advanced manufacturing stage. In FIG. 1d, a thin oxide layer 109 having characteristics similar to the oxide layer 102, that has previously been removed after formation of the p-well region 107 (various process steps in forming the structure shown in FIG. 1d have been omitted for the sake of simplicity) is formed on the substrate 101. A silicon nitride implantation mask 110 covering the central portion of the p-well region 107 and of the n-well region 105, respectively, is formed over the oxide layer 109. Moreover, a resist mask 111 having an appropriate thickness to block ions in a subsequent ion implantation step, covers the n-well region 105.

The semiconductor structure 100 bearing the implantation mask 110 and the resist mask 111 is then subjected to ion implantation, as indicated by arrows 112, for example, by accelerating boron ions onto the surface of the substrate 101, to form a doped region, indicated as dashed line 113 in FIG. 1d, near the surface portion of the p-well region 107. The region 113 is also referred to as a channel stop implant region, since the region 113 increases a threshold voltage of a parasitic MOS transistor so that a leakage current between the p-well region 107 and the n-well region 105 is significantly suppressed.

Figure 1E:
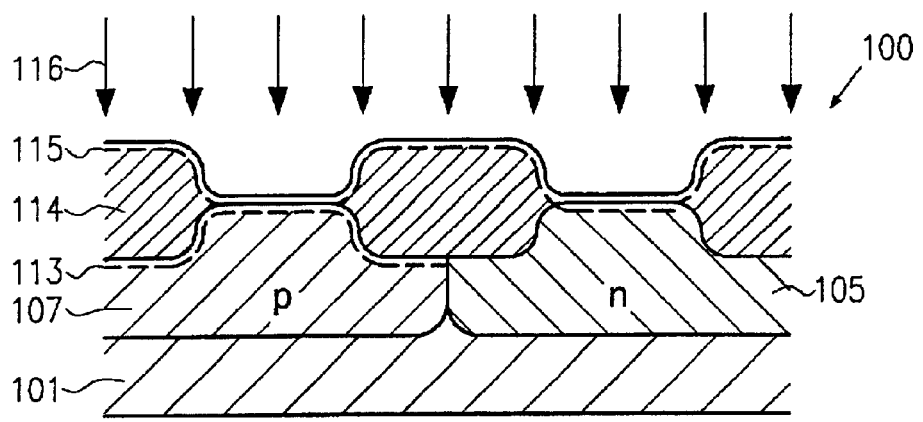

FIG. 1e schematically shows the semiconductor structure 100 in a further advanced manufacturing stage. In FIG. 1e, a relatively thick oxide layer 114, sometimes referred to as field oxide, having a thickness of several hundred nanometers, is formed between the p-well region 107 and the n-well region 105. Subsequently, the semiconductor structure 100 is subjected to a further ion implantation step, also referred to as implantation for threshold adjust and punch-through prevention, indicated by the arrows 116, to form a doped region at the surface portion of the field oxide 114, at the center portion of the p-well region 107 and at the n-well region 105. The doped region is indicated by the dashed line 115 in FIG. 1e. The additional implantation 116 serves to finely tune the threshold voltage of the transistor pair to be formed on the p-well region 107 and the n-well region 105. Additionally, the implantation 116 assists in eliminating, or at least drastically reducing, the punch-through effect between the two adjacent well regions 107, 105.

It should be noted that the various implantation steps described with reference to FIGS. 1a–1e are carried out with varying types of ions, i.e., typically boron and phosphorous ions, with varying acceleration voltages and doses to thereby obtain the dopant concentration and distribution required for the above-explained functionality. The various implantation steps entail implantation-induced damage in the crystal structure that should be repaired by one or more subsequent heat treatments to guarantee adequate performance of the completed semiconductor device. Moreover, the presence of crystalline damage and of dopant atoms in the vicinity of the surface of the substrate 101, and particularly at the central portion of the p-well region 107 and the n-well region 105, will significantly affect the formation of an ultra-thin gate oxide layer as is required for sophisticated CMOS transistor devices, since the ultra-thin gate oxide will exhibit a thickness of merely a few atomic layers.

As previously explained, heating the semiconductor structure 100 to an elevated temperature, on the other hand, leads to an increased diffusion of the dopant atoms and to an unwanted blur of the boundaries between adjacent material layers and regions, particularly between the p-well region 107 and the n-well region 105, thereby resulting in deteriorated device characteristics. For example, an undue diffusion of the dopant atoms in the region 115 may entail an alteration of the threshold voltage of the final device.

A further issue in manufacturing modem transistor devices arises from the fact that relatively low temperatures are required to reliably and reproducibly form a very thin gate oxide layer with a thickness of a few nanometers. Temperatures required for well-controllable formation of a gate oxide layer may therefore lie below a critical temperature $T_C$ that is required for repairing the crystal damage within a time period that allows to minimize the thermal budget during manufacturing of the semiconductor structure 100.

As a consequence of the above-mentioned issues, according to one illustrative embodiment the present invention provides a method of forming a thin gate oxide layer, starting from the semiconductor structure 100 as depicted in FIG. 1e.

Figure 1F:
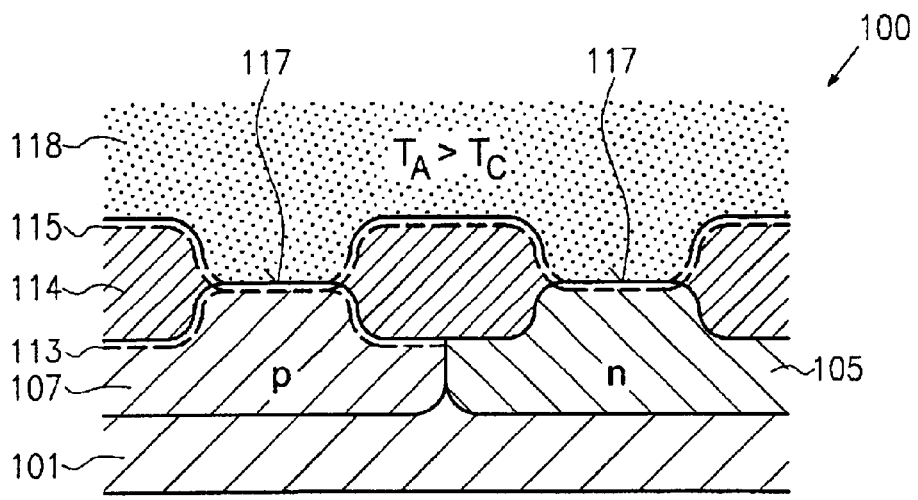

In FIG. 1f, the semiconductor structure 100 is schematically shown with any oxide removed from the central portions of the p-well region 107 and the n-well region 105 to define a clean surface 117. In this state, the semiconductor structure 100 is inserted in an inert gas ambient 118 that may, for example, substantially be comprised of nitrogen, argon, and the like. In this inert gas ambient 118, the semiconductor structure 100 is heated to an elevated temperature $T_A$ that is well above the critical temperature $T_C$ at which the crystal damage caused by the various implantation steps can be cured. Appropriate means for providing an inert gas ambient and elevated temperatures such as fast ramp furnaces and the like are well known in the art and a description thereof will be omitted. The inert gas ambient 118 ensures that any oxidation process at the surfaces 117 is substantially avoided.

Figure 1G:
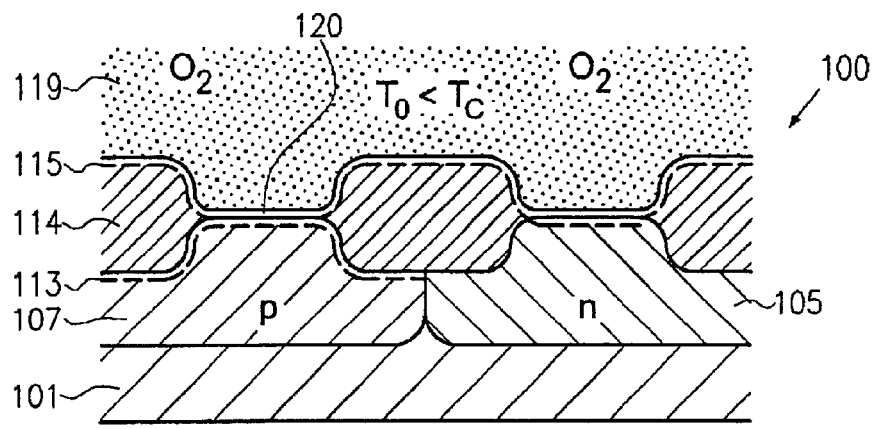

FIG. 1g schematically shows the semiconductor structure 100 at a manufacturing stage that immediately follows the step described with reference to FIG. 1f. In FIG. 1g, a thin gate oxide layer 120 is formed on the central portions of the p-well 107 and the n-well region 105, respectively, wherein the semiconductor structure 100 is inserted into an oxidizing ambient 119 comprising, for instance, oxygen and/or nitrogen oxide, such as NO and/or $N_2O$, and/or water vapor. Moreover, as previously explained, the temperature of the oxidizing ambient 119, denoted as $T_O$, is less than the critical temperature $T_C$ for curing the implantation-induced crystal damage. Due to the reduced oxidizing temperature $T_O$, the growth of the gate oxide layer 120 is well-controllable, even for an oxide thickness in the range of approximately 1–4 nm.

According to one illustrative embodiment, the annealing step shown with reference to FIG. 1f is carried out at a temperature of approximately 600–1100° C. for a time period of approximately 2–30 minutes. The subsequent thermal growth of the gate oxide layer 120 is carried out at a temperature of about 600–1100° C. for about 2–30 minutes, depending on the required thickness of the gate oxide layer 120.

According to one particular illustrative embodiment, the semiconductor structure 100 is kept within the process tool used for the annealing step, that is, an in situ process is carried out, wherein the temperature is lowered to the required oxidizing temperature $T_O$ and oxidizing agents such as oxygen and/or water vapor and/or nitrogen oxide are introduced into the inert gas ambient 118 to establish the oxidizing ambient 119. The temperature reduction from $T_A$ to $T_O$ is accomplished within several minutes, typically between approximately 2–5 minutes, wherein during this transition step the inert gas ambient 118 is substantially maintained for the sake of controllability of the thickness of the gate oxide layer 120. However, in a further embodiment, the oxidizing ambient 119 may be established during the transition step by gradually introducing oxygen and/or water vapor and/or by gradually replacing the inert gases by oxidizing gases.

Due to the additional annealing step (FIG. 1f), the number of implantation-induced defects is considerably reduced while at the same time the enhanced diffusivity of the dopant atoms that is caused by the elevated temperature will not result in an increased diffusion rate into the gate oxide, since the inert gas ambient 118 reliably avoids or at least significantly reduces the formation of any oxide on the exposed surfaces 117 during repairing of the implantation-induced damage. Thus, the growing of the gate oxide layer 120 is started with a minimum number of defects and a reduced diffusion rate due to the relatively low oxidation temperature $T_O$. The gate oxide layer 120 therefore exhibits a significantly improved reliability compared to a prior art gate oxide layer of comparable thickness due to the additional annealing step in an inert gas ambient.

Figure 2A:
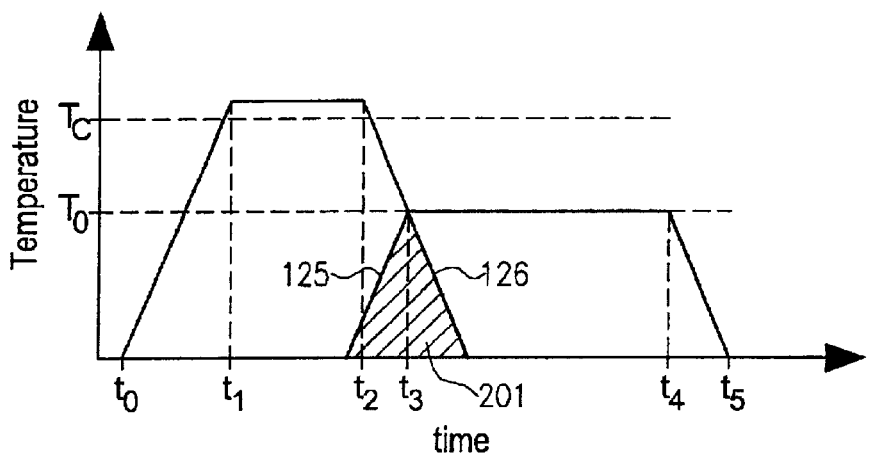
FIG. 2a and FIG. 2b graphically depict the thermal budget in a temperature versus time and in a diffusivity versus time diagram, respectively.

A further advantage of the present invention concerns the overall thermal budget in manufacturing the semiconductor structure 100 and will be described with reference to FIG. 2a and FIG. 2b. FIG. 2a shows a graph depicting the progression of the temperature of the method steps described with reference to FIGS. 1f and 1g with time. In FIG. 2a, $T_C$ denotes the minimum temperature required for repairing the implantation-induced damage to the substrate 101, wherein for the sake of simplicity only the highest curing temperature for the various implantation steps is indicated, since the damage caused by the various implantation steps may require different minimum temperatures to repair the respective damage. Moreover, a maximum oxidizing temperature required for well-controllably forming the gate oxide layer 120 is denoted as $T_O$. Note that $T_O$ does not represent a physical limit, such as the curing temperature $T_C$, since oxidation of silicon may be observed from room temperature to any temperature below the melting point of silicon, wherein the oxidation rate increases as the oxidizing temperature increases. Rather, $T_O$ is primarily dictated by equipment-inherent constraints, such as temperature uniformity across the substrate 101, time intervals required for cooling and heating the substrate 101, and the like. Thus, the maximum oxidizing temperature $T_O$ depends on equipment and process requirements (cycle time) and is according to the present invention selected within a range of approximately 600–1100° C. to ensure reproducibility of the oxidation process.

At time $T_O$ the semiconductor structure 100 is inserted into the inert gas ambient 118 and the temperature of the semiconductor 100 is rapidly increased during a ramp-up step. At time $T_1$, the temperature $T_C$ is achieved or slightly exceeded and the annealing step for curing the implantation-induced damage is carried out until a time $T_2$, at which point the lowering of the temperature of the semiconductor structure 100 is begun, with the required oxidizing temperature $T_O$ finally being reached at time $T_3$. At time $T_3$ or slightly before or slightly after $T_3$ or during the interval $T_2$–$T_3$, the oxidizing ambient 119 is established and the semiconductor structure 100 is oxidized at an approximately constant temperature $T_O$ until time $T_4$. At time $T_4$, the temperature of the semiconductor structure 100 is lowered with a slope depending on process requirements to reach room temperature at time $T_5$. According to one embodiment, the oxidizing ambient 119 is removed at time $T_4$ by, for example, purging the ambient 119 with an inert gas such as nitrogen and the like. In another embodiment, the oxidizing ambient 119 is maintained during the cooling down of the semiconductor structure 100, wherein the cooling rate, i.e., the slope of the curve between $T_4$ and $T_5$ is selected to complete the gate oxide layer 120 so as to exhibit the required final thickness. As previously explained, the area under the curve of the diagram in FIG. 2a is a measure of the thermal budget involved in performing the steps for curing implantation-induced damage and forming the oxide layer 120. The hatched area 201 in FIG. 2a indicates the area that can be "saved" when the above-explained in situ process is used, thereby minimizing the thermal budget during formation of the gate oxide layer 120. According to one embodiment, it is, however, possible to perform the annealing step and the oxidizing step in different process tools, thereby requiring heat-up and cool-down intervals as indicated by the solid lines 126 and 125, respectively, in FIG. 2a.

Figure 2B:
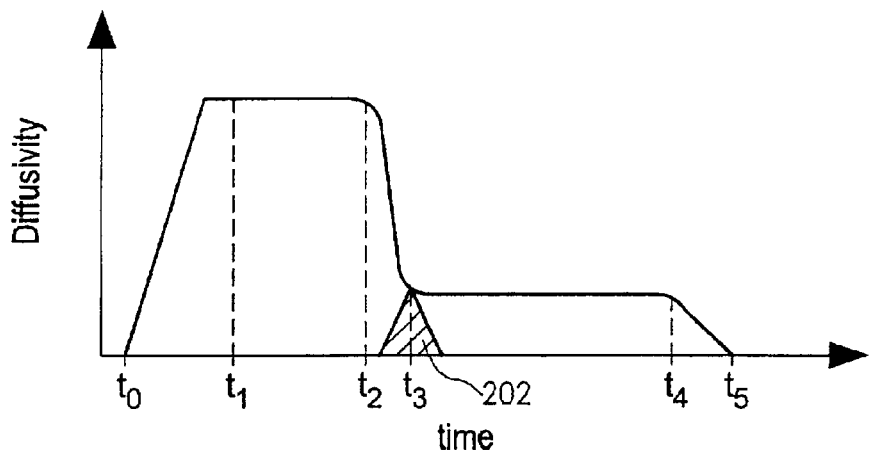

FIG. 2b shows a graph depicting the diffusivity of the dopant atoms versus time, wherein the corresponding times $T_0$–$T_5$ are indicated in conformity with FIG. 2a. In principle, the diffusivity-time-diagram also describes the thermal budget of the processes involved, similar to FIG. 2a, wherein the diffusivity additionally includes the activation energies for the various processes. In order to obtain an optimum ratio between repair of implantation induced damage and out-diffusion of dopant atoms, the area under the curve in FIG. 2b shall be minimized. Thus, by immediately performing an annealing step in an inert gas ambient and a subsequent oxidation step with significantly reduced temperature to thereby effect only a low diffusivity, as indicated in FIG. 2b, a highly reliable gate oxide layer can be formed that exhibits a minimal number of defects which would otherwise be caused by implantation-induced damage and out-diffused dopant atoms.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an oxide layer on a surface portion of a substrate having implanted semiconductor regions formed therein, wherein the method comprises:

establishing an inert gas ambient;

exposing the substrate to the inert gas ambient;

annealing the substrate to reduce implantation-induced damage in said semiconductor regions;

transforming said inert gas ambient into an oxidizing ambient to form said oxide layer on said surface portion of said substrate, wherein a temperature during formation of the oxide layer is less than a temperature during annealing of the substrate; and reducing a temperature of the substrate while transforming said inert gas ambient into an oxidizing ambient.

2. The method of claim 1, wherein a thickness of said oxide layer is in the range of approximately 1–5 nm.

3. The method of claim 1, wherein the inert gas ambient is established using at least one of argon and nitrogen.

4. The method of claim 1, wherein the temperature during formation of the oxide layer is in the range from approximately 600–1100° C.

5. The method of claim 1, wherein the temperature during annealing of the substrate is in the range from approximately 600–1100° C.

6. The method of claim 1, wherein the substrate is annealed for approximately 2–30 minutes.

7. The method of claim 1, wherein the substrate is exposed to the oxidizing ambient for approximately 2–30 minutes.

8. The method of claim 1, further comprising reducing a temperature of the substrate prior to transforming said inert gas ambient into an oxidizing ambient.

9. The method of claim 1, wherein an oxidizing agent is added to the inert gas ambient.

10. A method of forming an oxide layer on a surface portion of a substrate having implanted semiconductor regions formed therein, wherein the method comprises:

establishing an inert gas ambient;

exposing the substrate to the inert gas ambient;

annealing the substrate at a first temperature to reduce implantation-induced damage in said semiconductor regions;

transforming said inert gas ambient into an oxidizing ambient at a second temperature that is less than said first temperature to form said oxide layer on said surface portion of said substrate; and reducing a temperature of the substrate while transforming said inert gas ambient into an oxidizing ambient.

11. The method of claim 10, wherein a thickness of said oxide layer is in the range of approximately 1–5 nm.

12. The method of claim 10, wherein the inert gas ambient is established using at least one of argon and nitrogen.

13. The method of claim 10, wherein the second temperature during formation of the oxide layer is in the range from approximately 600–1100° C.

14. The method of claim 10, wherein the first temperature during annealing of the substrate is in the range from approximately 600–1100° C.

15. The method of claim 10, wherein the substrate is annealed for approximately 2–30 minutes.

16. The method of claim 10, wherein the substrate is exposed to the oxidizing ambient for approximately 2–30 minutes.

17. The method of claim 10, further comprising reducing a temperature of the substrate prior to transforming said inert gas ambient into an oxidizing ambient.

18. The method of claim 10, wherein an oxidizing agent is added to the inert gas ambient.

19. A method of forming an oxide layer on a surface portion of a substrate having implanted semiconductor regions formed therein, wherein the method comprises:

establishing an inert gas ambient;

exposing the substrate to the inert gas ambient;

annealing the substrate in said inert gas ambient at a first temperature to reduce implantation-induced damage in said semiconductor regions, said anneal process being performed for a duration ranging from approximately 2–30 minutes; and reducing a temperature of the substrate while transforming said inert gas ambient into an oxidizing ambient to form said oxide layer on said surface portion of said substrate by performing an anneal process at a second temperature that is less than said first temperature.

* * * * *